(12) United States Patent
Parker et al.

(10) Patent No.: US 9,152,264 B2
(45) Date of Patent: Oct. 6, 2015

(54) ELECTRONIC DEVICE WITH PIEZOELECTRIC ACTUATOR

(71) Applicant: IMMERSION CORPORATION, San Jose, CA (US)

(72) Inventors: Daniel Gregory Parker, San Francisco, CA (US); Kohei Imoto, Santa Clara, CA (US); Allan Visitacion, Fremont, CA (US); Trevor Jones, Campbell, CA (US); Neil Olien, Montreal, CA (US); Jesica Ferro, Redwood City, CA (US); Li Jiang, Union City, CA (US)

(73) Assignee: IMMERSION CORPORATION, San Jose, CA (US)

( * ) Notice: Subject to any disclaimer, the term of this patent is extended or adjusted under 35 U.S.C. 154(b) by 0 days.

(21) Appl. No.: 14/542,971

(22) Filed: Nov. 17, 2014

(65) Prior Publication Data

US 2015/0070289 A1    Mar. 12, 2015

Related U.S. Application Data

(63) Continuation of application No. 13/683,190, filed on Nov. 21, 2012, now Pat. No. 8,890,666.

(60) Provisional application No. 61/562,199, filed on Nov. 21, 2011.

(51) Int. Cl.
*G08B 6/00* (2006.01)
*G06F 3/041* (2006.01)
*G06F 1/16* (2006.01)
*H01L 41/053* (2006.01)
*H01L 41/09* (2006.01)
*G06F 3/01* (2006.01)

(52) U.S. Cl.
CPC .............. *G06F 3/041* (2013.01); *G06F 1/1626* (2013.01); *G06F 3/016* (2013.01); *G08B 6/00* (2013.01); *H01L 41/053* (2013.01); *H01L 41/094* (2013.01); *G06F 2203/014* (2013.01)

(58) Field of Classification Search
CPC ....................................................... G06F 3/041
USPC .............. 340/407.1–407.2; 345/173; 715/702
See application file for complete search history.

(56) References Cited

U.S. PATENT DOCUMENTS

| | | | |
|---|---|---|---|
| 5,245,245 A * | 9/1993 | Goldenberg | 310/330 |
| 8,542,105 B2 | 9/2013 | Grant et al. | |
| 2004/0227721 A1* | 11/2004 | Moilanen et al. | 345/107 |
| 2006/0270954 A1* | 11/2006 | Tumey | 601/70 |
| 2011/0121953 A1* | 5/2011 | Grant et al. | 340/407.1 |
| 2011/0204752 A1* | 8/2011 | Gao et al. | 310/339 |
| 2011/0216027 A1* | 9/2011 | Kim et al. | 345/173 |
| 2011/0267181 A1 | 11/2011 | Kildal | |
| 2012/0038582 A1 | 2/2012 | Grant | |
| 2012/0206371 A1 | 8/2012 | Turunen et al. | |

OTHER PUBLICATIONS

International Search Report and Written Opinion as issued for International Application No. PCT/US2012/066281, dated Feb. 5, 2013.

* cited by examiner

*Primary Examiner* — Eric M Blount
(74) *Attorney, Agent, or Firm* — Pillsbury Winthrop Shaw Pittman LLP

(57) ABSTRACT

An electronic device includes a touch screen configured to receive an input from a user, and a haptic device that includes a piezoelectric actuator including an elongated piezo bender having a mass at one end thereof and supported by a flexible holder at the other end thereof, and an electrical driving signal generator configured to generate a signal to create a vibration in the elongated piezo bender in response to the input from the user.

9 Claims, 4 Drawing Sheets

ELECTRONIC DEVICE WITH PIEZOELECTRIC ACTUATOR

CROSS-REFERENCE TO RELATED APPLICATIONS

This application is a continuation application of U.S. patent application Ser. No. 13/683,190, filed Nov. 21, 2012, which claims the benefit of priority from U.S. Provisional Patent Application No. 61/562,199, filed Nov. 21, 2011, the entire contents of both of which are incorporated herein by reference.

FIELD

The present invention is related to an electronic device with a piezoelectric actuator.

BACKGROUND

Electronic device manufacturers strive to produce a rich interface for users. Conventional electronic devices often provide visual and/or auditory feedback to communicate information to users. In some cases, kinesthetic feedback (such as active and resistive force feedback) and/or tactile feedback (such as vibration, texture, and heat) may also be provided to the user to enhance the user experience. Generally speaking, kinesthetic feedback and tactile feedback are collectively known as "haptic feedback" or "haptic effects." Haptic feedback may be useful for providing cues to alert the user of specific events or to provide realistic feedback sensations to create a greater sensory experience. Haptic feedback can be used with common electronic devices and even devices used for creating a simulated or virtual environment.

Various haptic actuation technologies have been used in the past to provide vibrotactile haptic feedback to touch sensitive devices, such as touch screens. Known haptic feedback devices use electric actuators, such as Linear Resonant Actuator ("LRA") devices and Eccentric Rotating Mass ("ERM") devices. However, these actuators usually have very limited bandwidth to perform sufficiently in haptic applications.

Another conventional haptic feedback technology in touch sensitive devices is electro-active polymer ("EAP") devices. One drawback of this technology, however, is that EAP-based actuators normally require thousands of volts of electricity to provide effects that are suitable for haptic applications.

Development of haptic feedback structures has led to smaller, more compact devices. As display screens having high definition have increased, so has the need for high definition haptic feedback.

SUMMARY

According to an aspect of embodiments of the present invention, there is provided an electronic device that includes a touch screen configured to receive an input from a user, and a haptic device that includes a piezoelectric actuator including an elongated piezo bender having a mass at one end thereof and supported by a flexible holder at the other end thereof, and an electrical driving signal generator configured to generate a signal to create a vibration in the elongated piezo bender in response to the input from the user.

BRIEF DESCRIPTION OF THE DRAWINGS

The components of the following figures are illustrated to emphasize the general principles of the present disclosure and are not necessarily drawn to scale. Reference characters designating corresponding components are repeated as necessary throughout the figures for the sake of consistency and clarity.

DETAILED DESCRIPTION

The present disclosure describes embodiments of haptic devices that include haptic feedback actuators that impose haptic effects on a user via a user interface, human-computer interface, or other portions of a user device on which or within which the actuators reside. In particular, the embodiments of the haptic devices described herein can be configured to apply haptic effects to a touch sensitive surface of a user device. The touch sensitive surface, in some embodiments, can be part of a display device that may include both a visual output mechanism and a touch sensitive input mechanism. Thus, haptic feedback can be applied in user devices, such as electronic handheld devices, for providing a rich sensory experience for the user.

Although many of the examples described herein relate to touch screen devices, it should be understood that the present disclosure also encompasses other types of human-computer interfaces involving touch sensitive structures. In addition, other features and advantages will be apparent to one of ordinary skill in the art upon reading and understanding the general principles of the present disclosure. These other features and advantages are intended to be included in the present disclosure as well.

Figure 1:
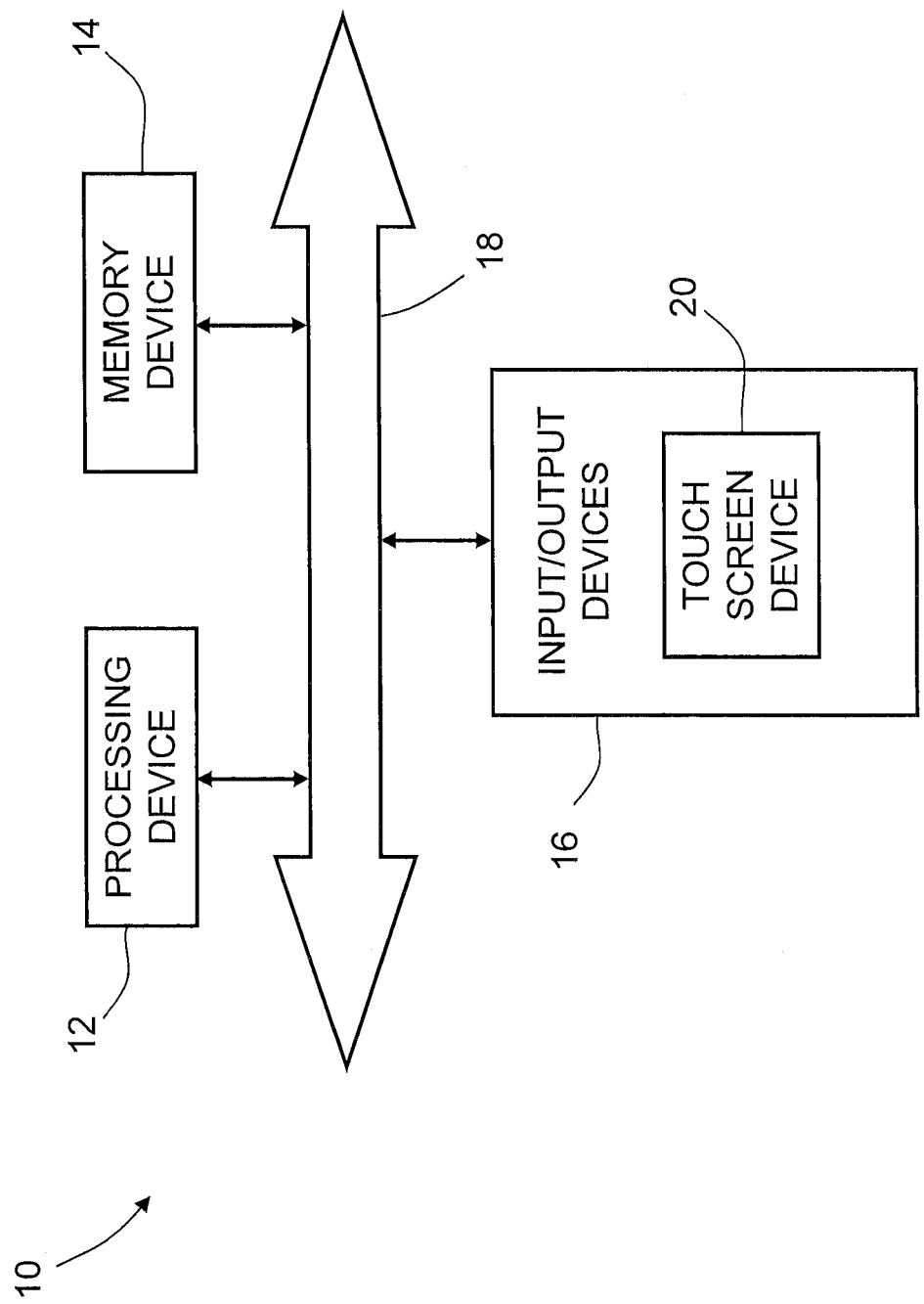
FIG. 1 is a block diagram showing a general schematic of an electronic device, according to embodiments of the invention.

FIG. 1 is a block diagram of an electronic device 10 in accordance with one embodiment. More particularly, the electronic device 10 includes a processing device 12, a memory device 14, and input/output devices 16, which are interconnected via a bus 18. Furthermore, the input/output devices 16 include a touch screen device 20 or other human-computer interface devices.

The touch screen device 20 may be configured as any suitable human-computer interface or touch/contact surface assembly. The touch screen device 20 may be any touch screen, touch pad, touch sensitive structure, computer monitor, laptop display device, workbook display device, kiosk screen, portable electronic device screen, or other suitable touch sensitive device. The touch screen device 20 may be configured for physical interaction with a user-controlled device, such as a stylus, finger, etc. In some embodiments, the touch screen device 20 may include at least one output device and at least one input device. For example, the touch screen device 20 might include a visual display and a touch sensitive screen superimposed thereon to receive inputs from a user's finger. The visual display may include a high definition display screen.

In various embodiments, the touch screen device 20 provides haptic feedback to at least a portion of the electronic device 10, which can be conveyed to a user in contact with the electronic device 10. Particularly, the touch screen device 20 can provide haptic feedback to the touch screen itself to impose a haptic effect when the user in is contact with the screen. The haptic effects can be used to enhance the user experience, and particularly can provide a confirmation to the user that the user has made sufficient contact with the screen to be detected by the touch screen device 20.

The electronic device 10 may be any device, such as a desk top computer, laptop computer, electronic workbook, electronic handheld device (such as a mobile phone, gaming device, personal digital assistant ("PDA"), portable e-mail device, portable Internet access device, calculator, etc.), kiosk (such as an automated teller machine, ticking purchasing machine, etc.), printer, point-of-sale device, game controller, or other electronic device.

The processing device 12 may be a general-purpose or specific-purpose processor or microcontroller for managing or controlling the operations and functions of the electronic device 10. For example, the processing device 12 may be specifically designed as an application-specific integrated circuit ("ASIC") to control output signals to a driver of the input/output devices 16 to provide haptic effects. The processing device 12 may be configured to decide, based on predefined factors, what haptic effects are to be played, the order in which the haptic effects are played, and the magnitude, frequency, duration, and/or other parameters of the haptic effects. The processing device 12 can also be configured to provide streaming motor commands that can be used to drive the haptic actuators for providing a particular haptic effect. In some embodiments, the processing device 12 may actually include a plurality of processors, each configured to perform certain functions within the electronic device 10.

The memory device 14 may include one or more internally fixed storage units, removable storage units, and/or remotely accessible storage units. The various storage units may include any combination of volatile memory and non-volatile memory. The storage units may be configured to store any combination of information, data, instructions, software code, etc. More particularly, the storage devices may include haptic effect profiles, instructions for how the haptic actuation devices of the input/output devices 16 are to be driven, or other information for generating haptic effects.

In addition to the touch screen device 20, the input/output devices 16 may also include specific input mechanisms and output mechanisms. For example, the input mechanisms may include such devices as keyboards, keypads, cursor control devices (e.g., computer mice), or other data entry devices. Output mechanisms may include a computer monitor, virtual reality display device, audio output device, printer, or other peripheral devices. The input/output devices 16 may include mechanisms that are designed to not only receive input from a user and but also provide feedback to the user, such as many examples of touch screen devices. The touch screen device 20 and other input/out devices 16 may include any suitable combination and configuration of buttons, keypads, cursor control devices, touch screen components, stylus-receptive components, or other data entry components. The touch screen device 20 may also include any suitable combination of computer monitors, display screens, touch screen displays, haptic or tactile actuators, haptic effect devices, or other notification devices for providing output to the user.

Figure 2:
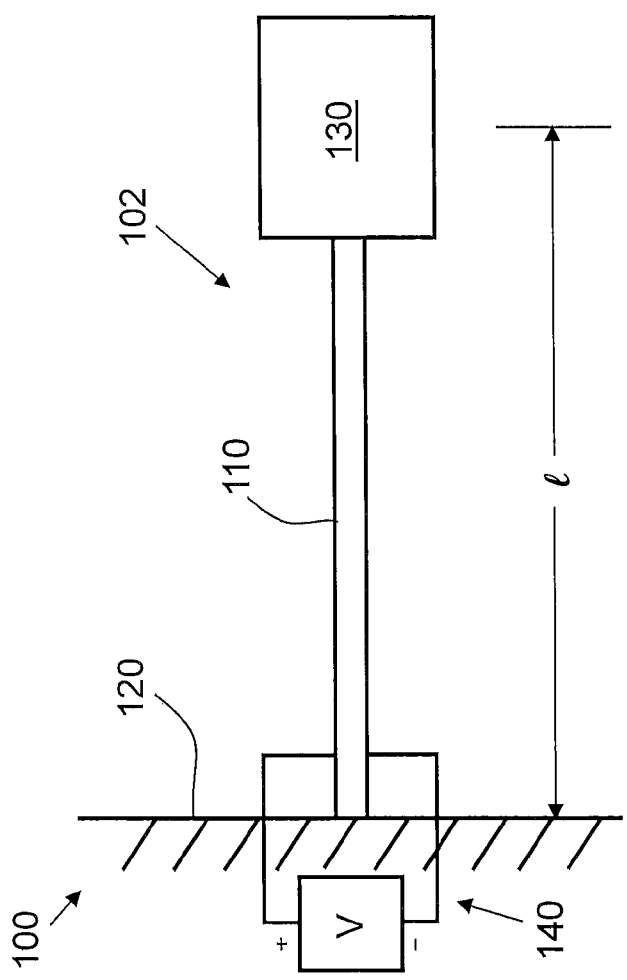
FIG. 2 is a schematic cross-sectional view of a haptic device according to an embodiment of the invention.

FIG. 2 illustrates an embodiment of a haptic device 100 that may be used as part of the input/output devices 16 of FIG. 1. As illustrated, the haptic device 100 includes an actuator 102 that includes a piezo bender 110 having a thin elongated body that is supported at or near one end by a holder 120 that is configured to hold the piezo bender 110 in a manner that restrains movement of the portion of the piezo bender 110 being held. Piezo benders are known in the art and generally include at least one layer of piezo ceramic material and at least one layer of a metal substrate. A mass 130 is attached to an end of the piezo bender 110 that is opposite the holder 120. As illustrated in FIG. 2, the piezo bender 110 may be connected to an electrical driving circuit 140 that is configured to generate an electrical driving signal based on an input signal. When the electrical driving signal is applied to the piezo bender 110 across two surfaces of the piezo bender 110, the piezo bender 110 will begin to deflect. By varying the frequency of the electrical driving signal, the piezo bender 110 will vibrate. The frequency and amplitude of the driving signal provided by the driving circuit 140, the natural mechanical resonant frequency of the piezo bender 110, the length of the piezo bender, and the size of the mass 130 will control the frequency and amplitude of the vibration of the piezo bender 110 and haptic effect provided by the haptic device. The mass 130 may be connected to the piezo bender 110 by any suitable means, such as with an adhesive.

When the proper voltage is applied to the piezo bender 110, the piezo bender 110 will bend from the fixed end, moving the mass 130 back and forth. The motion of the mass 130 provides acceleration to the attached system. By varying the length of the cantilever distance l and the size of the attached mass 130, both frequency and acceleration may be controlled. In an embodiment, the center of gravity of the mass 130 may be positioned as far as possible from the holder 120, while still fitting in the space constraints of the haptic device 100.

Figure 3:
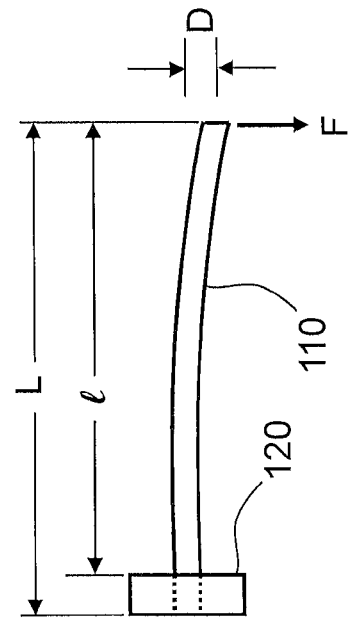
FIG. 3 is a schematic view of a portion of the haptic device of FIG. 2.

As illustrated in FIG. 3, if it is assumed that the holder 120 is an ideal fixed clamp at one end of the piezo bender 110 and the mass 130 is firmly attached at the other end of the piezo bender 110, the system is governed by the following equations:

$$\omega = 2\pi f = \sqrt{\frac{K}{m}} \qquad (1)$$

$$K = \frac{C_f EI}{L^3} \qquad (2)$$

where ω is the resonant frequency of the system, K is the stiffness of the system, and m (in kg) is the floating mass 130 attached to the piezo bender 110 plus the mass of the piezo bender 110 itself. In equation (2), L (in meters) is the distance cantilevered from the holder 120 providing the fixed mount, and $C_f$ is a clamping factor that can range from 0 to 3 for the cantilever configuration illustrated in FIG. 3. A clamping factor $C_f$ of 3 indicates a perfectly stiff holder, while a lower value represents a holder with some compliance, i.e., a flexible holder. Further, EI in equation (2), which is an actuator modulus, may be calculated for a particular piezo bender using a cantilevered beam fixture to measure static free displacement D and blocking force F:

$$EI = \frac{Fl^3}{3D} \qquad (3)$$

where F in equation (3) is the force of the piezo bender, l is the length of piezo bender 110 minus a length of the piezo bender that is clamped in the holder 120, for example, 3 mm, and D is the static free displacement, as illustrated in FIG. 3.

Combining equations (1)-(3) above for modulus (EI), beam stiffness (K), and resonant frequency (ω) yields a single equation (4) that may be used to describe the actuator system:

$$\omega = 2\pi f = \sqrt{\frac{C_f F l^3}{3m\Delta L^3}} \qquad (4)$$

It is possible to predict a resonant frequency based on a particular piezo actuator's performance and moving mass by using equation (4).

The clamping factor $C_f$ may be controlled through the use of epoxies and/or mechanical means. As noted above, the clamping factor $C_f$ can range from 0 (totally loose) to 3 (traditional hard mount). By using a flexible holder (mount) through the use of epoxy and/or mechanical means, the clamping factor $C_f$ may be reduced to between about 1 and about 2, and desirably between about 1 and about 1.5. By lowering the clamping factor $C_f$, the overall resonant frequency may be lowered to a range that is acceptable to use in the haptic device 100.

Figure 4:
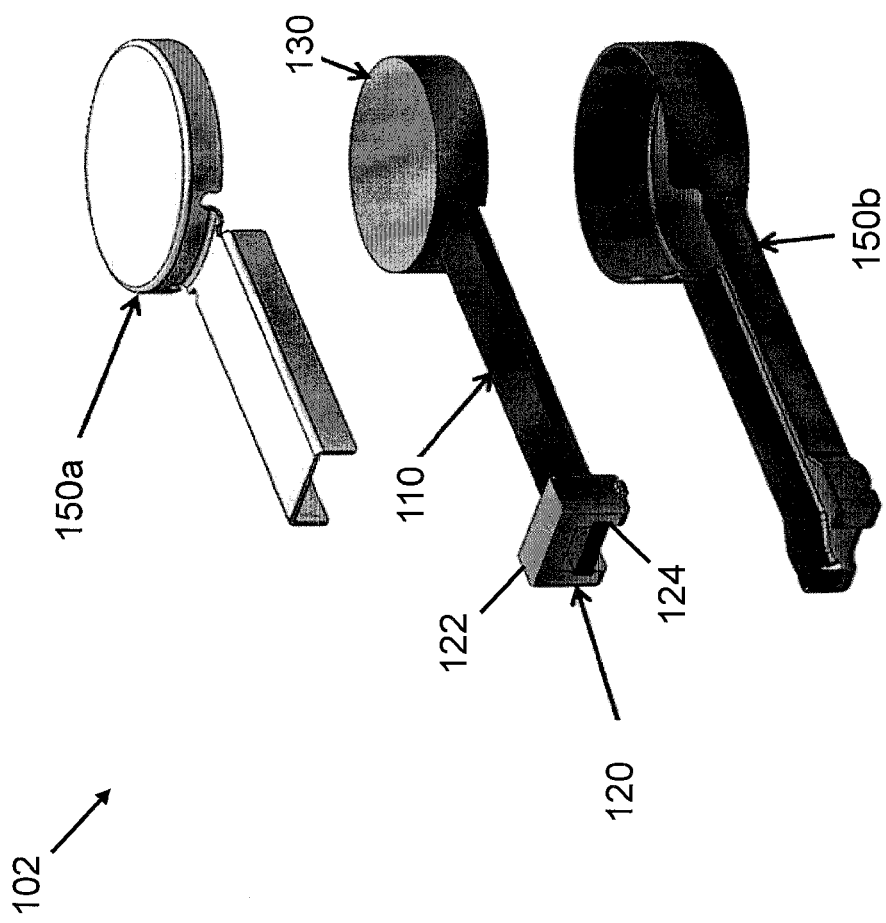
FIG. 4 is an exploded view of an actuator portion of the haptic device of FIG. 2.

FIG. 4 illustrates an embodiment of the actuator 102 illustrated in FIG. 2. As illustrated, the holder 120 includes a structure 122, which may be molded from a plastic material, that may be part of a housing of the electronic device 10 described above, or may be a separate structure that may be attached to the housing. In an embodiment, the holder 120 may also include an epoxy 124 or some other resin that may be used to attach the piezo bender 110 to the structure 122. The actuator 102 may include a top cover 150a and a bottom cover 150b that surround and protect the piezo bender 110 and the mass 130.

Figure 5:
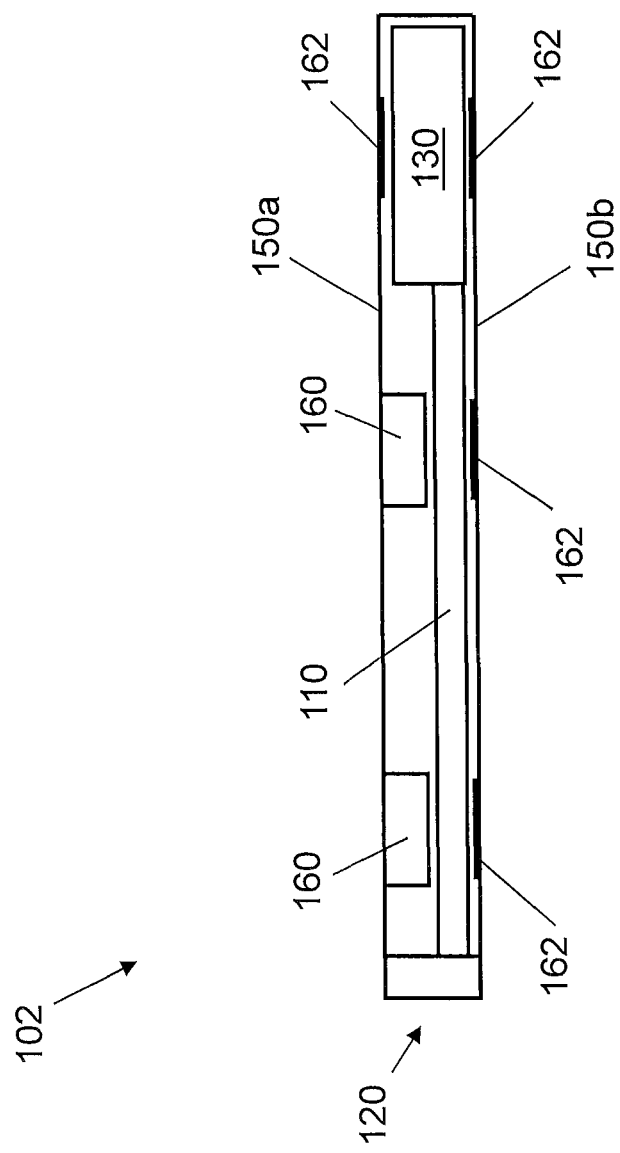
FIG. 5 is a schematic side view of an embodiment of the actuator of FIG. 4.

FIG. 5 illustrates an embodiment of the actuator 102 of FIG. 4 with the addition of hard stops 160 and soft stops 162 that may be placed at specific locations around the piezo bender 110 and the mass 130. The terms "hard" and "soft" are relative terms meant to describe materials having different hardness values, as understood by one of skill in the art. The hard stops 160 and the soft stops 162 are configured to allow the piezo bender 110 and the mass 130 to be minimally constrained and perform normally when the voltage is applied to the piezo bender 110, yet protect the piezo bender 110 and the mass 130 from high accelerations that are generated if the haptic device 100 is accidentally dropped. More or less hard stops 160 and soft stops 162 may be used. The illustrated embodiment is not intended to be limiting in any way.

In alternative embodiments, other shapes for the piezo-based actuators may be used. The illustrated embodiments are not intended to be limiting in any way. In addition, the piezo materials, described herein may be replaced with other smart materials that are used in actuators, such as a shape memory alloy ("SMA"). In an embodiment, the piezo-based actuators may also be configured to be sensors to sense an input from a user of the electronic device. Aspects of embodiments of the present invention may be used in other actuators, and not just for the resonant actuators of the haptic devices disclosed herein. In addition, aspects of embodiments of the present invention may provide an improved level of compatibility and performance, as compared to haptic devices known in the art, which may be suitable for high definition devices.

Embodiments of the present invention may be used as the actuation unit to enable haptic feedback in various electronic devices, such as touch screen handheld devices (mobile devices, PDA, and navigation systems), automotive applications, gaming consoles, etc.

The embodiments described herein represent a number of possible implementations and examples and are not intended to necessarily limit the present disclosure to any specific embodiments. Instead, various modifications can be made to these embodiments as would be understood by one of ordinary skill in the art. Any such modifications are intended to be included within the spirit and scope of the present disclosure and protected by the following claims.

What is claimed is:

1. An electronic device, comprising:
   a touch screen device configured to receive an input from a user; and
   a haptic device comprising
      a piezoelectric actuator comprising an elongated piezo bender having a mass at one end thereof and supported by a flexible holder at the other end thereof; and
      an electrical driving signal generator configured to generate a signal to create a vibration in the elongated piezo bender in response to the input from the user.

2. The electronic device according to claim 1, wherein a clamping factor provided by the flexible holder is between about 1 and about 3.

3. The electronic device according to claim 2, wherein the clamping factor is between about 1 and about 2.

4. The electronic device according to claim 3, wherein the clamping factor is between about 1 and about 1.5.

5. The electronic device according to claim 1, wherein the electronic device is a handheld device.

6. The electronic device according to claim 5, wherein the electronic device a mobile device.

7. The electronic device according to claim 1, wherein the piezoelectric actuator is configured to be a sensor to sense the input from the user.

8. The electronic device according to claim 1, wherein the touch screen device comprises a visual display.

9. The electronic device according to claim 8, wherein the visual display comprises a high definition display screen.

* * * * *